United States Patent [19]

Yanushonis et al.

[11] 4,069,074

[45] Jan. 17, 1978

[54] METHOD OF MANUFACTURING SEMICONDUCTOR DEVICES

[76] Inventors: Styapas Styapono Yanushonis, ulitsa Antakalne, 94, kv. 31; Bronjus-Vitautas Bronyaus Belyauskas, ulitsa Antakalne, 75, kv. 78; Vida-Katrina Jule Sherkuvene, ulitsa G.Gaya, 24, kv. 3; Vladas Klemovich Banjulis, ulitsa Ateites, 11, kv. 512, all of Vilnjus, U.S.S.R.

[21] Appl. No.: 647,010

[22] Filed: Jan. 7, 1976

[51] Int. Cl.² .................................... H01L 21/225
[52] U.S. Cl. ........................ 148/188; 29/571; 148/187
[58] Field of Search .............. 148/187, 188; 156/17; 29/571

[56] References Cited

U.S. PATENT DOCUMENTS

| | | | |
|---|---|---|---|
| 3,193,418 | 7/1965 | Cooper et al. | 148/189 |
| 3,418,181 | 12/1968 | Robinson | 148/187 |
| 3,566,518 | 3/1971 | Brown et al. | 29/571 |
| 3,608,189 | 9/1971 | Gray | 29/571 |
| 3,646,665 | 3/1972 | Kim | 29/571 |
| 3,698,078 | 10/1972 | Redington | 156/17 |
| 3,764,410 | 10/1973 | Hays | 148/187 |
| 3,933,529 | 1/1976 | Goser | 148/1.5 |

*Primary Examiner*—G. Ozaki
*Attorney, Agent, or Firm*—Lackenbach, Lilling & Siegel

[57] ABSTRACT

A method of manufacturing semiconductor devices consisting in that a substrate of a semiconductor material having the first type of conductivity is coated with a doping and a masking layer, a photoresist pattern being formed on the upper layer, a technological structure is formed by means of removing certain areas until the semiconductor substrate is reached, an insulating layer is formed around this structure, a region having the second type of conductivity is formed in the semiconductor layer by diffusing the impurity from the doping layer, windows are exposed within the technological structure by removing at least two areas of the technological structure along the perimeter thereof until the semiconductor substrate is reached, the impurity is diffused through at least one of the windows and a metallization pattern is then formed.

8 Claims, 35 Drawing Figures

METHOD OF MANUFACTURING SEMICONDUCTOR DEVICES

The present invention relates to methods of manufacturing semiconductor devices and, more particularly, to the technology of producing semiconductor structures and integrated circuits in which micron and submicron doped regions are located quite accurately with respect to each other.

It is known that basic characteristics of semiconductor devices are determined by the size and geometry thereof. An optimum geometry for many devices would consist of a series of narrow elongated regions having different electrical characteristics. Thus, the source and drain regions of a field-effect transistor are made as two narrow elongated zones of the same type of conductivity that appear on the surface, having the channel zone and the gate contact between them. The smaller the distance between the source and the drain the higher the cut-off frequency of the device. In order to obtain a certain operating current and an improved frequency response in high speed bipolar devices it is required that the ratio of the length of the emitter to the size of its area be large. The emitter, therefore, is made as a long strip of minimum width. In order to obtain low base resistance and low emitter-base capacity it is necessary to reduce the distance between the emitter and the contact window of the base, as well as its total width.

The main reason preventing further reduction of the dimensions of the elementary regions is the well known limit set by classical photolithography and photomask alignment errors that take place in the successive structure shaping process. In practice the photolithography limit is set at one to two microns, and the alignment margin is evaluated to be of the same magnitude.

There are known several technological solutions (see, for instance, French Pat. No. 2,133,808, U.S. Pat. No. 3,839,104 and No. 3,847,687 which allow partial reduction of the alignment margin and ensure that the distances between small structures are made precisely to the required tolerances. This is achieved by means of transferring the patterns of the smallest structures, such as a window for emitter diffusion and a base contact window, onto one and the same photomask and by making a respective pattern in the masking layer above the base region. The, the windows made in this way are partially closed by masking layers having different etching characteristics, the emitter and p-regions are diffused and contact windows are exposed with the use of selective etchants. In this case, however, both the dimensions of the smallest structures and the distances between them are determined by the possibilities of the photolithographic process.

Also known is a method of obtaining small structures having a width of one micron and even less using the process of transverse etching of local coatings comprising two or more layers with different etching characteristics, the etching of the layers being carried out with the help of selective etchants (see, for instance, U.S. Pat. No. 3,753,807, and No. 3,764,410). In this case the transverse dimension of the structure is determined by the duration of the etching procedure. Hence, the limit for the minimum dimension of the structure is not set by the size of the pattern on the photomask but by the accuracy of the chemical processes only. For instance, the method of manufacturing transistor structures as described in the U.S. Pat. No. 3,764,410 envisages the following sequence of operations: applying the doping and masking layers onto a substrate of the first type of conductivity, producing a photoresist pattern; using selective etchants to form a two-layer technological structure; producing an insulating layer on the substrate around the structure that has been formed and creating a region of the second type of conductivity in the substrate by diffusing the dopant from the doping layer of the technological structure.

The exposure of windows located within the doped region and the diffusion of the dopant of the first type of conduction through one open window makes it possible to produce an emitter region about one micron wide and ensures that the emitter is self-aligned with respect to the narrow part of the base zone.

It is the object of the present invention is to improve the basic parameters of semiconductor devices by reducing the dimensions of diffusion regions, the widths of windows, the distances from diffusion region boundaries to the windows and the distances between the windows.

Another object of the present invention is to reduce the dimensions of diffusion regions in semiconductor devices.

Another object of the present invention is to reduce the widths of the windows to be exposed in the insulation layer.

Another object of the present invention is to reduce the distances between the windows to be exposed in the insulation layer.

Another object of the present invention is to provide a method of manufacturing semiconductor devices having self-aligned small structures obtained with the use of directional coating technology.

Another object of the present invention is to provide a method of manufacturing semiconductor devices having self-aligning small structures obtained with the use of the local oxidation technology.

Another object of the present invention is to provide a heterogeneous doping glass of submicron thickness whose properties would satisfy the requirements of the technology of manufacturing high-quality semiconductor devices.

Another object of the present invention is to design a heterogeneous doping glass technological structure permitting the production of self-aligning windows of preset dimensions in the insulation layer.

Another object of the present invention is to provide a shielding layer of a preset permeability.

These objects are achieved by a method of manufacturing semiconductor devices containing at least two layers, one of which is a doping layer and the other a masking layer, being applied onto a substrate made of a semiconductor material having the first type of conductivity; a photoresist pattern being produced on the upper layer; a technological structure being formed by removing a part of the applied layers up to the semiconductor substrate; an insulating layer being placed around the technological structure; the dopant being diffused from the doping layer so that a region of the second type of conductivity is produced in the semiconductor substrate; windows being exposed within the boundaries of the technological structure; an impurity being diffused through at least one of the windows and then the metallization pattern is formed and, according to the invention, the windows are exposed by removing at least two regions of the technological structure along the perimeter thereof until the semiconductor substrate is reached. The layers of the technological structure in parallel with the substrate are selectively etched followed by the selective etching away of the lower layers existing in the region left unprotected by the previously etched layer.

Preferably the second masking layer is applied partially onto the technological structure or onto the semiconductor substrate below a section of the technological structure to limit the number and the lengths of windows to be exposed.

The insulating layer around the technological structure could be deposited by sputtering.

Preferably again the doping layer is coated with a shielding layer while the insulating layer around the technological structure is formed by oxidizing the semiconductor substrate.

Preferably borosilicate glass is used as a material for the doping layer, aluminum-silicate glass or silicon nitride is used as a material for the masking layer while the technological structure is formed by removing certain areas of the applied doping and masking layers by an etchant that would affect the doping layer at a rate higher than that at which the masking layer is etched.

Preferably again the first masking layer is coated with a second masking layer of, for instance, molybdenum. In this case, while the technological structure is being formed, the area of the second masking layer uncovered by the photoresist can be removed by an etchant that would not affect the first masking layer.

The technological structure can be formed by removing the first masking layer from the shielding layer along the perimeter thereof within an area corresponding to the required width of windows to be exposed. It can be done with the use of an etchant etching the doping and the first masking layers at approximately the same rate, and the shielding layer at a lower rate. The windows can be exposed by etching selectively the uncoated areas of the shielding and doping layers.

Preferably the material used for the doping layer is a borosilicate glass comprising 0.5 - 5 weight percent of boron oxide, the material used for the shielding layer is an aluminium-silicate glass comprising 30-95 weight percent of aluminium, and the material used for the first masking layer is silicon oxide, while the deposited layers are etched in an etchant comprising 1-7 volume parts of hydrofluoric acid, 1-3 volume parts of glacial acetic acid, 5-10 volume parts of a one percent solution of oxalic acid, 2-4 volume parts of orthophosphoric acid.

The invention will be now described with reference to specific embodiments thereof taken in conjunction with the accompanying drawings wherein:

FIG. 1 a, b, c, shows a sequence of operations to form a technological structure according to one embodiment of the invention;

Figure 13:
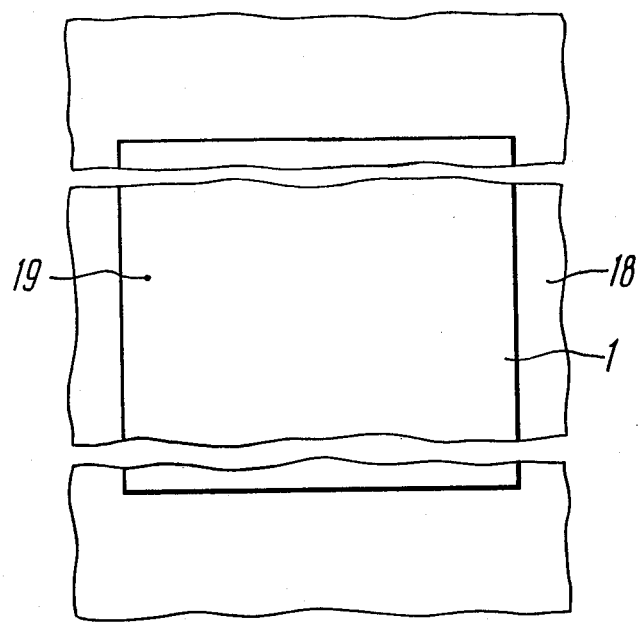
Figure 14:
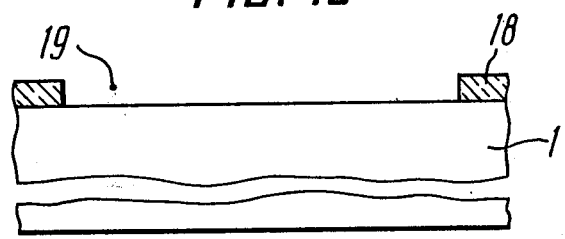
Figure 15:
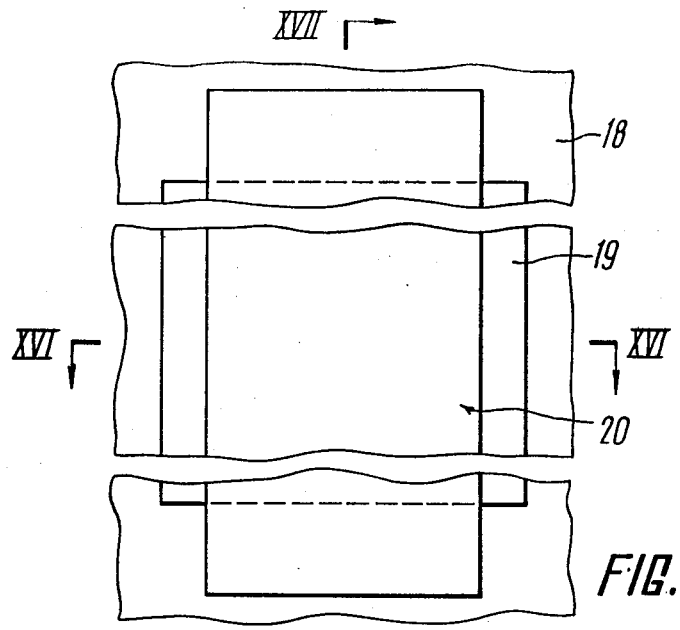
Figure 16:
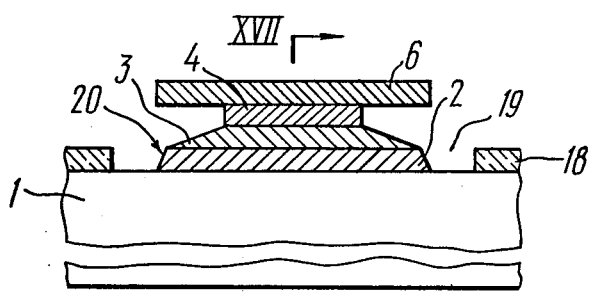
Figure 17:
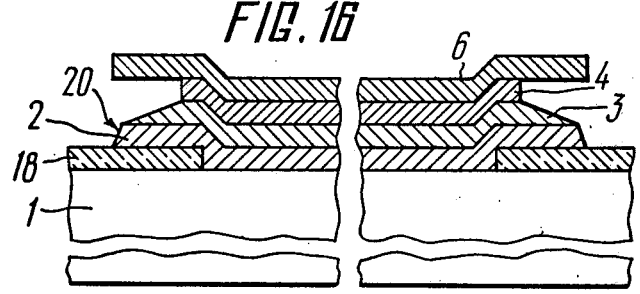
Figure 18:
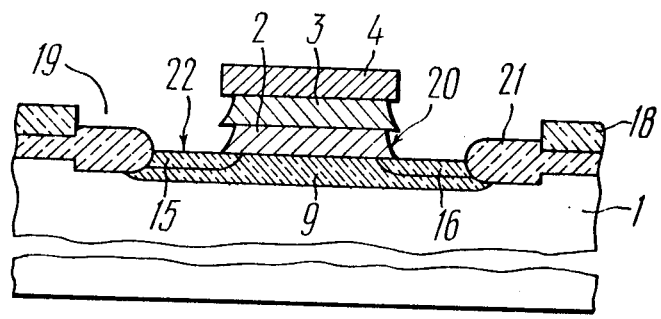
Figure 19:
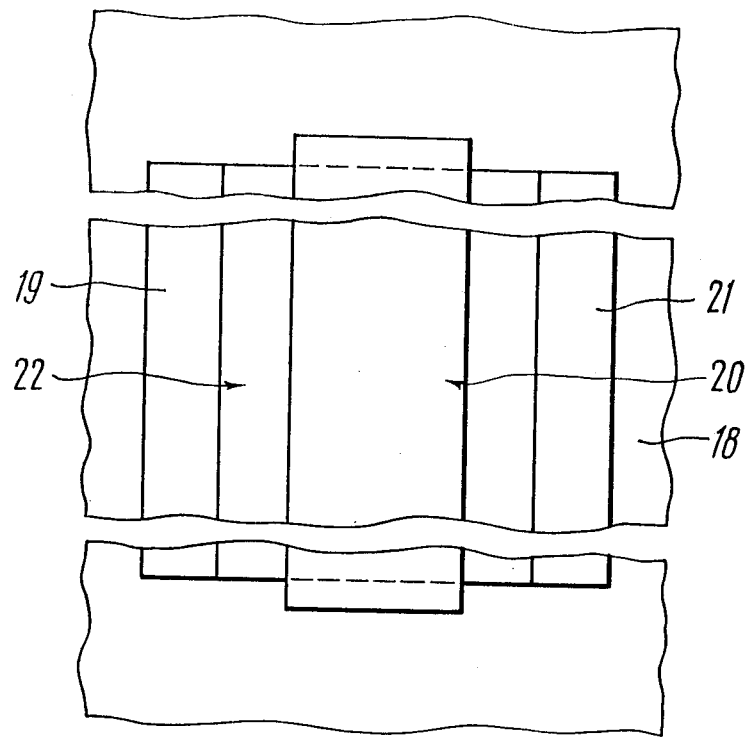
Figure 20A:
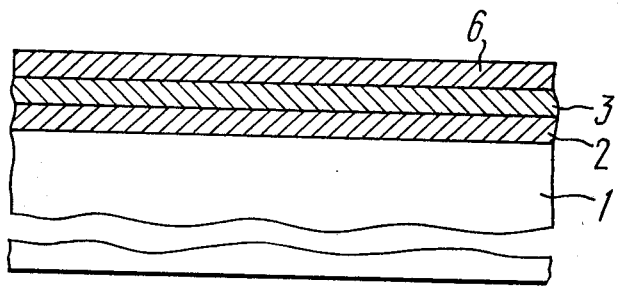
Figure 20B:
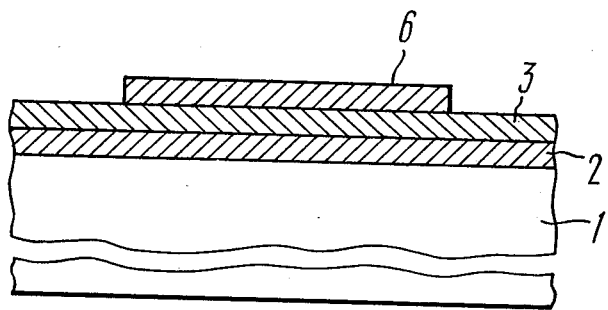
Figure 20C:
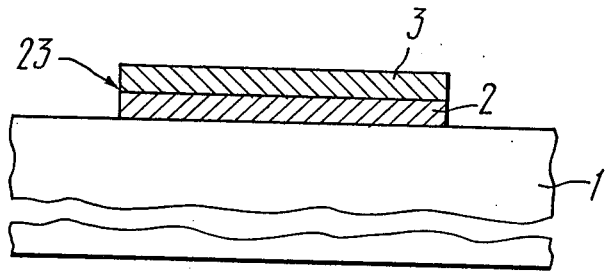
Figure 21:
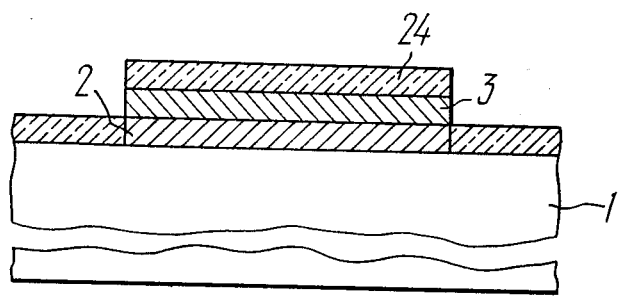
Figure 22:
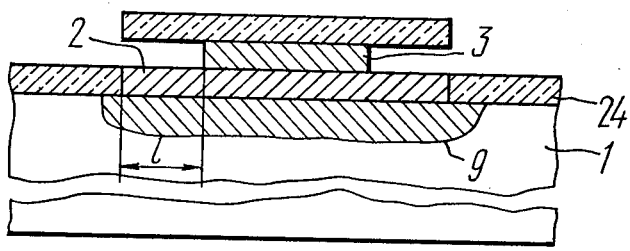
Figure 23:
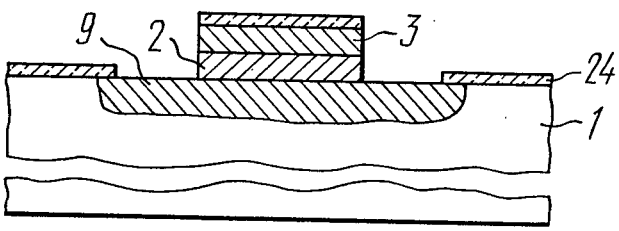
Figure 25:
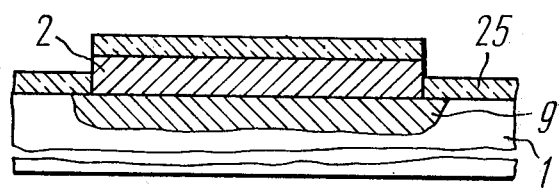

FIG. 12 a, b, c, d, illustrates another version of forming the technological structure, according to the invention;

FIG. 13 shows a top view of a wafer with an additional masking layer formed before the technological structure is finished, according to another embodiment of the invention;

FIG. 14 shows a cross section of FIG. 13;

FIG. 15 shows a top view of a substrate with a technological structure on the additional masking layer;

FIG. 16 shows a section view along line XVI—XVI of FIG. 15;

FIG. 17 shows a section view along line XVII—XVII of FIG. 15;

FIG. 18 shows a cross section of a transistor structure made according to the given example of the embodiment of the invention;

FIG. 19 shows a top view of FIG. 18;

FIG. 20, a, b, c, illustrates another version of shaping a technological structure, according to the invention;

FIG. 21 shows an operation to form an insulating layer, according to the invention;

FIG. 22 shows a way of removing a part of the technological structure;

FIG. 23 illustrates the procedure of exposing windows according to the present embodiment;

FIG. 24, a, b, c, illustrates still another version of the procedure to form a technological structure, according to the invention;

FIG. 25 presents a way of producing the insulating layer; and

Figure 26:
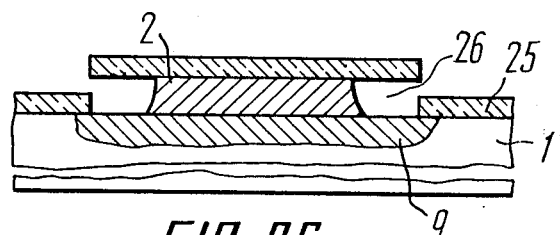

FIG. 26 illustrates an operation of exposing windows with the use of selective etchants, according to the given embodiment of the invention.

The proposed method of manufacturing semiconductor devices consists in that a technological structure is formed on a semiconductor substrate having the first type of conductivity with the use of a photomask, the structure containing a dopant of the second type of conductivity and being characterized by a high etching rate in the transverse direction, when it is etched in a certain etchant, and by a low etching rate in the direction normal to the substrate. A considerable part of the technological structure perimeter is made of either straight or curved lines which are located with respect to each other at distances approaching the photolithographic limit. An insulating layer is made around the technological structure on the semiconductor substrate. An area of the second type of conductivity is made then in the substrate by means of diffusing a dopant from said structure. Then at least two windows are exposed within the boundaries of every doped region by means of removing certain areas of the technological structure along the perimeter thereof. The widths of the windows in this case are determined by the duration of the etching process, while their lengths and numbers are preset by the use of an additional masking layer. Then a semiconductor structure of the required type is produced by diffusing dopant through at least some of the exposed windows. Contact windows are exposed by removing doping glasses with the use of selective etchants.

There exist many practical embodiments for implementing this method which are well in the scope of the present invention. These embodiments will be discussed in what follows. According to one of them an additional masking layer bearing a certain pattern limiting the widths of windows to be exposed is applied onto a technological structure. In this case the windows are exposed along the perimeter of the technological structure in the areas that have not been coated with the additional masking layer. Another version of implementing the invention envisages that an additional masking layer is placed between the semiconductor substrate and the technological structure. In this case it is a strip of the technological structure running along the perimeter thereof that is removed and access to the substrate is ensured in those points that have not been coated with the additional masking layer.

To produce an insulating layer around the technological structure the substrate is subjected to a thermal oxidation procedure. The technological structure in this case should be able to resist the penetration of oxidizers. In another embodiment the insulating layer is produced by directional application of an insulating material, for instance, by means of high-frequency sputtering. In this case the technological structure should be of a certain thickness while its side walls should have a tilt angle approaching 90°.

The operations of doping, transverse etching and shielding against oxidizers can be performed in structures of non-uniform thickness quite easily. In principle it is possible to produce technological structures whose composition and properties vary gradually. From the technological point of view, however, it is more desirable that the structure be layer-heterogeneous, that is it should be a multilayer one. In this case the different etching rates of various layers, when affected by a uniform etch, make it possible to etch the structure in the transverse direction, while every separate layer performs a certain single function, for instance, it could be the source of a dopant or a shield against the penetration of oxidizers, or it can combine a number of functions.

One of the embodiments of the present invention envisages that a technological structure is formed by doping and insulating layers. The doping layer is etched according to the photoresist pattern until the uncoated area and a part of the coated area are removed. The insulating layer is produced by the directional application technology, for instance, by high-frequency sputtering. In this case a part of the masking layer located on the substrate serves as an insulating layer, while the part that is located on the doping layer permits exposed windows along the perimeter of the structure by means of transversely etching away the doping layer after the diffusion process is over. In this embodiment to manufacture bipolar silicon n-p-n transistor structures borosilicate glass containing 0.5–5 weight percent of boron oxide is used, which is applied from a solution, and the masking and the insulating layers are made of silicon nitride applied by means of reactive sputtering.

In another embodiment, when a photoresist pattern is used the technological structure is formed from doping and masking layers while the insulating layer is applied by means of high-frequency sputtering.

Other embodiments of the present invention envisage that a shielding layer is produced between the doping and the first masking layers, while the insulating layer around the technological structure is made by oxidizing the substrate. The technological structure is formed with the use of an etchant which etches the shielding layer at a slower rate than that at which it etches the doping and the first masking layers. By selecting the proper materials and a respective etchant it is possible to reduce the width of the first masking layer along the perimeter of the shielding layer by an amount that would correspond to the required window width. The windows are exposed by selectively etching away the uncoated areas of the shielding and doping layers after the dopant has been diffused from the doping layer.

Another embodiment provides for an increased accuracy of the pattern. To this end the first masking layer is coated with another masking layer which is characterized by strong adhesion to the first layer. Then, the areas of the second masking layer unprotected by the photoresist are removed with the use of an etchant that does not etch the first masking layer, while the layers located below are removed with the use of an etchant that does not etch the second masking layer. When manufacturing bipolar silicon transistors, it is preferable that the doping layer be made of borosilicate glass, the shielding layer be made of aluminium-silicate glass (from 30 to 90 weight percent of alumina, the first masking layer be made of silicon oxide and the second masking layer be made of molybdenum. By varying the weight percent composition of the aluminum-silicate glass it is possible to produce shielding layers having different permeabilities and etching rates.

When the doping, shielding and the first masking layers are applied onto the structure from solutions of the above mentioned materials, an etchant, having an etching rate of the shielding layer lower than the etching rate of the two other layers is used, the etchant comprising 1–7 volume parts of hydrofluoric acid, 1–3 volume parts of glacial acetic acid, 5–10 volume parts of a 1% -solution of oxalic acid and 2–4 volume parts of orthophosphoric acid. The higher the percent content of the orthophosphoric acid in the compound the higher the etching rate of the aluminum silicate glass, the narrower the strip of this material that runs along the perimeter of the structure and is not covered by the masking layer and the smaller the width of window to be exposed. The higher the percent content of the hydrofluoric acid, the wider the width of the window.

The proposed method of manufacturing transistor structures envisages that the required dimensions of the doped region of the second type of conductivity, for instance, the base region in a bipolar transistor, are ensured by etching the doping layer in the process of producing the technological structure. Windows of micron or submicron width that are self-aligned with the diffusion region are produced by transverse etching after the diffusion process is over and by using an insulating layer. In this case it is not the resolution of the photolithographic process that determines the widths of windows and the gaps therebetween, but the accuracy of the chemical process involved. Besides, the method makes it possible to reduce the distance between the window and the boundary of the doped region.

The invention will now be described in greater detail with reference to specific embodiments thereof taken in conjunction with the accompanying drawings.

EXAMPLE 1

FIGS. 1 through 11 illustrate an example of practical implementation of the proposed method, wherein four layers are used in a technological structure, the length of windows is limited with the help of an additional masking layer applied onto the technological structure and thermal oxidation process is employed to produce an insulating layer.

Figure 1A:
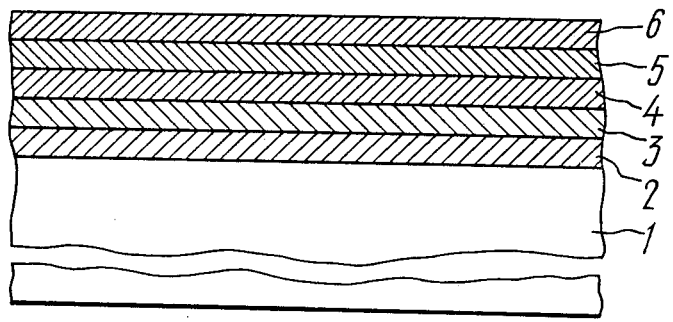
Figure 1B:
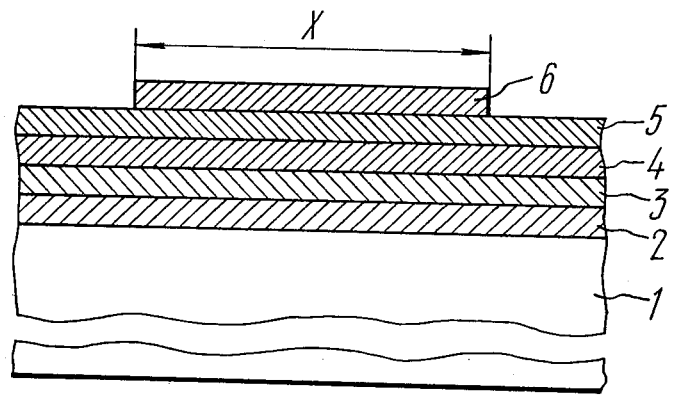
Figure 1C:
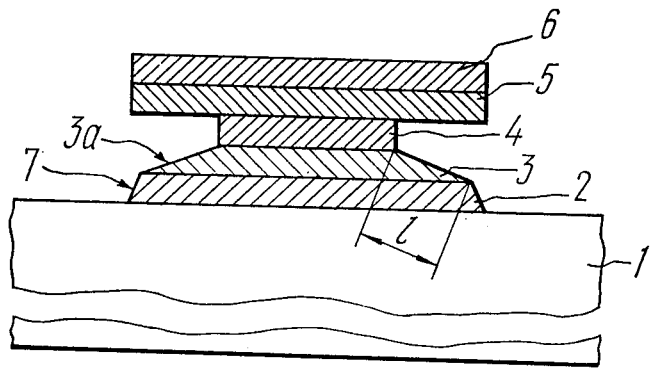
Figure 2:
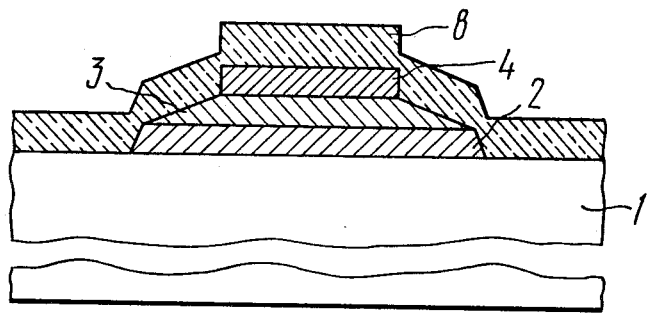
FIG. 2 illustrates an operation of applying the additional masking layer, according to the invention.
Figure 3:
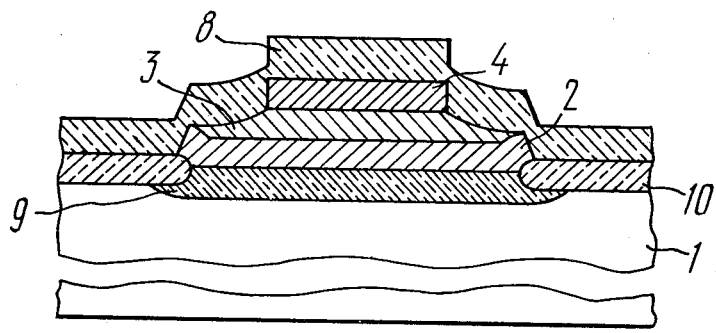
FIG. 3 shows a substrate with a technological structure after diffusion and thermal oxidation, according to the invention.
Figure 4:
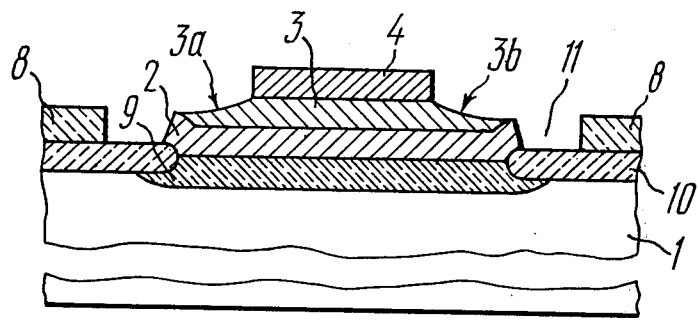
FIG. 4 illustrates a cross section of an operation for limiting the areas where the windows to be exposed are located.
Figure 5:
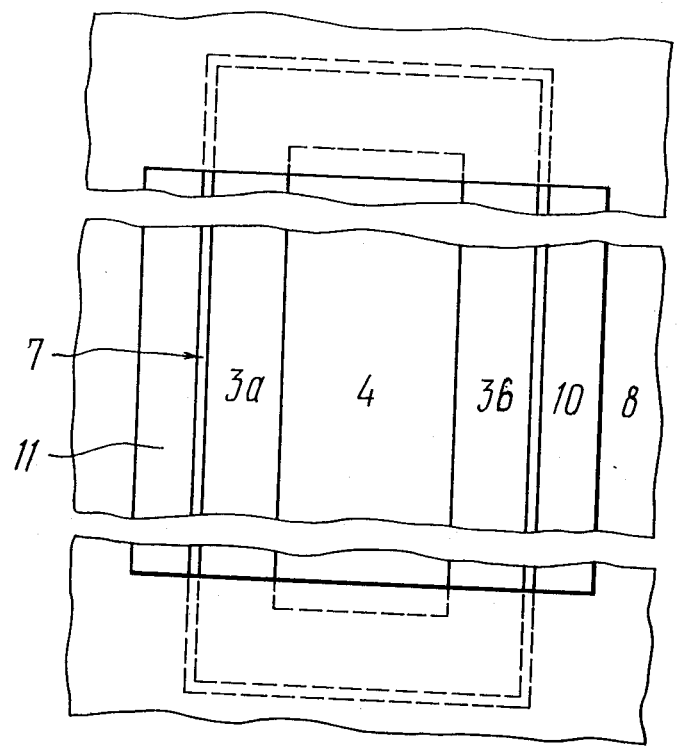
FIG. 5 shows a top view of FIG 4.

A wafer of monocrystalline silicon bearing an n-epitaxial layer with specific resistance of 1.0 to 1.5 Ohm.cm is used as a substrate 1 (FIG. 1 a). Applied onto the substrate 1 is a doping layer 2 of borosilicate glass containing about three weight percent of boron oxide and having a thickness of about 0.13 microns. The doping layer is deposited from a solution with subsequent annealing in an argon atmosphere (temperature about 700° C, duration 10 min). Placed above the doping layer 2 is a shielding layer 3 made of aluminum-silicate glass (75 weight percent of alumina) about 0.1 microns thick, a first masking layer 4 of silicon oxide 0.15 microns thick and a second masking layer 5 of molybdenum 0.15 microns thick. The layers 3 and 4 are deposited from respective solutions, while the layer 5 is applied by vacuum deposition. Then, a photoresist layer 6 is applied. Well known photoengraving techniques (which will not be described herein) are used to form a pattern of the photoresist layer 6 corresponding to the form of the region to be doped (FIG. 1 b; cross section shown); preferably it is a narrow strip of the width X. Then an etchant consisting of glacial acetic acid (three volume parts), orthophosphoric acid (five volume parts), de-ionized water (one volume part) and nitric acid (seven volume parts) is used to remove an area of the layer 5 that is not protected by the photoresist 6. The next step is to use an etchant consisting of hydrofluoric acid (one volume part), glacial acetic acid (one volume part), oxalic acid (one-percent solution, nine volume parts) and orthophosphoric acid (three volume parts) to etch away the lower layers until the semiconductor wafer is reached and a technological structure 7 is obtained, as shown in FIG. 1c. Since the second etchant etches the first masking layer 4 at a rate higher than that at which it etches the shielding layer 3 and does not affect the layer 5 at all, in the course of etching the layer 3 and the layer 2, the layer 4 will be etched away in the transverse direction and a strip 3a will be formed on the shielding layer 3 along the area unprotected with the masking layer 4. The width of the strip will be about 1 micron.

Then, any known process is used to remove the photoresist 6 and the second masking layer 5 and by means of high-frequency sputtering an additional masking layer 8 (FIG. 2) of silicon dioxide about 0.1 micron thick is applied onto the substrate 1 bearing the technological structure 7. The structure is thermally treated in an argon atmosphere at about 1,100° C for 10 min and then in a water vapour atmosphere for 50 min.

Figure 6:
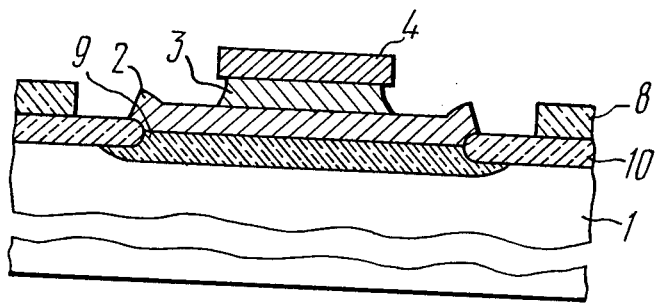
FIG. 6 illustrates removal of a part of a technological structure, according to the invention.
Figure 7:
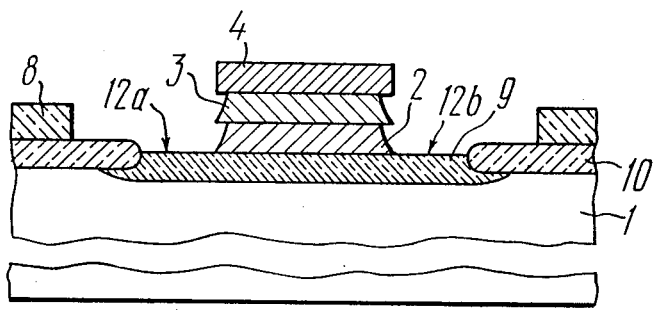
FIG. 7 shows an operation of exposing two windows, according to the invention.
Figure 8:
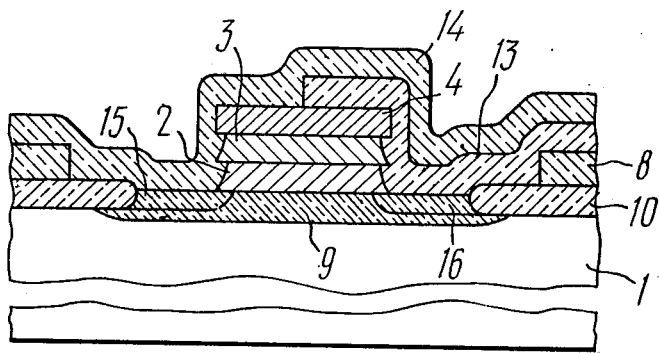
FIG. 8 shows a substrate with a technological structure after impurities have been diffused through the exposed windows, according to the invention.

Due to the diffusion of boron from the doping layer 2 a region 9 with the second type of conductivity is formed in the substrate 1 and due to the effect the oxidizing atmosphere has on the surface unprotected with the shielding layer 3 on insulating layer 10 (FIG. 3) of thermally produced silicon dioxide is obtained whose thickness is about 0.6 microns. A strip of a thermally produced silicon dioxide also appears below the edge of the shielding layer 3. The width of the strip is approximately equal to the thickness of the layer 10. The next operation consists in that a window 11 (FIG. 4) is exposed to the additional masking layer 8 so that the middle section of the technological structure 7 would be open while the ends of the structure 7 would remain covered as in FIG. 4 and FIG. 5. Another result of the same procedure consists in that two strips 3a and 3b of shielding layer unprotected with the first masking layer become exposed. The operation is not critical as to the alignment accuracy since the width of the window 11 exceeds that of the technological structure 7 to a considerable extent while the alignment is required mainly along the structure 7. During subsequent operations unprotected regions 3a and 3b of the shielding layer 3 are removed by etching in orthophosphoric acid at 180° C as shown in FIG. 6, while unprotected regions of the doping layer are removed with the use of an etchant consisting of orthophosphoric acid (19 volume parts) and hydrofluoric acid (four volume parts). Thus, two windows 12a and 12b (FIG. 7) are exposed. The widths of the windows at the level of the substrate 1 are about 1.5 microns.

While manufacturing a bipolar transistor one of the windows, for instance, the window 12a is used for diffusing the emitter and the other window 12b serves as a contact window of the base.

Figure 11:
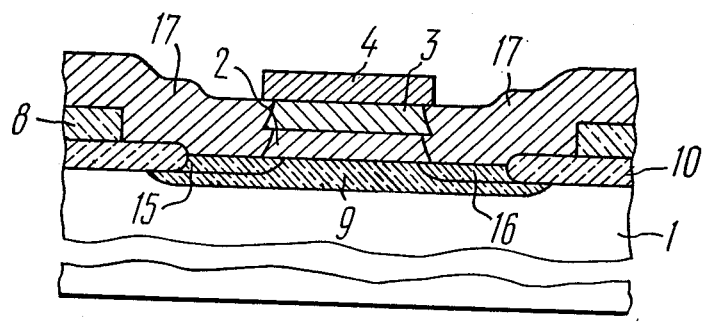
FIG. 11 shows a transistor structure after metallization, according to the invention.

For this purpose the substrate with exposed windows is coated with a layer 13 (FIG. 8) which is heavily doped with a dopant of the second type of conductivity, for instance with borosilicate glass containing 10 to 50% of boron oxide (in the present example there is 20 weight percent of boron oxide), the thickness of the layer being about 0.15 microns. Then, this layer 13 is removed photolithographically from the window 12a, and another layer 14 is applied, the layer being heavily doped with a dopant of the first type of conduction, for instance phosphosilicate glass containing about 50 weight percent of phosphorus pentoxide. The thickness of the layer 14 is 0.15 microns. Then the substrate is heat treated at about 950° C in an argon atmosphere for 20 min. The diffusion process results in that an emitter region 15 (FIG. 9) and a base enhancement region 16 are formed on the substrate 1. After the heat treatment the layer 14 is removed with the help of a P-etch containing three volume parts of hydrofluoric acid, two volume parts of nitric acid and 60 volume parts of de-ionized water, the window 12a (FIG. 7) is covered with a photoresist and the layer 13 is removed with the help of an etchant containing 19 volume parts of orthophosphoric acid and four volume parts of hydrofluoric acid. The result is a structure with a cross section shown in FIG. 9 and a top view in FIG. 10. Then, one of the known procedures is employed to produce a metallization pattern 17 as shown in FIG. 11.

EXAMPLE 2

FIGS. 12a through 12d illustrate a series of operations allowing to form a doping source which has a shielding layer of the same thickness throughout the structure.

Figure 9:
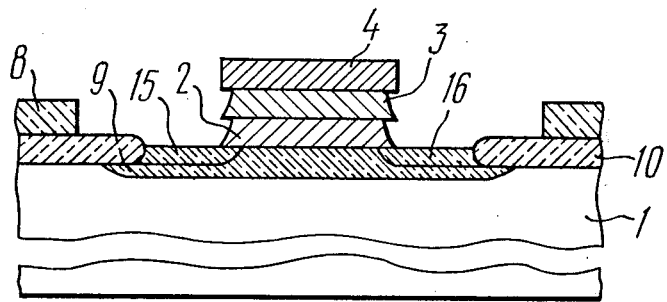
FIG. 9 shows a cross section of a transistor structure with exposed contact windows.
Figure 10:
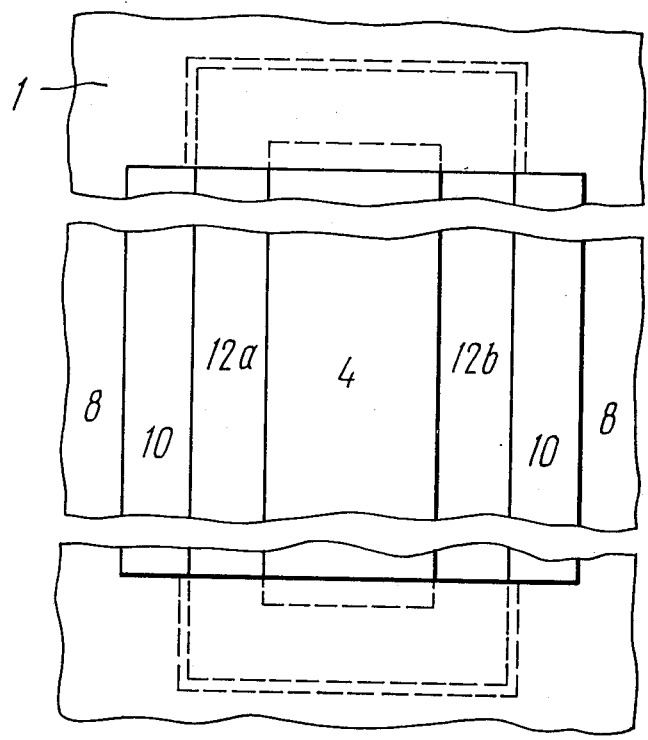
FIG. 10 shows a top view of FIG. 9.
Figure 12A:
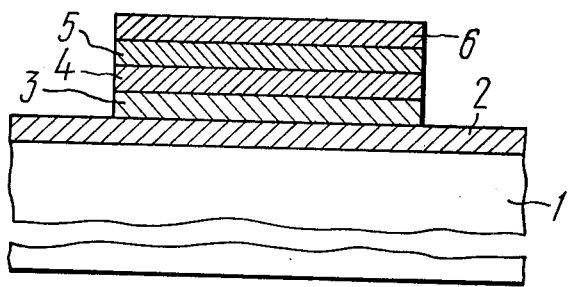
Figure 12B:
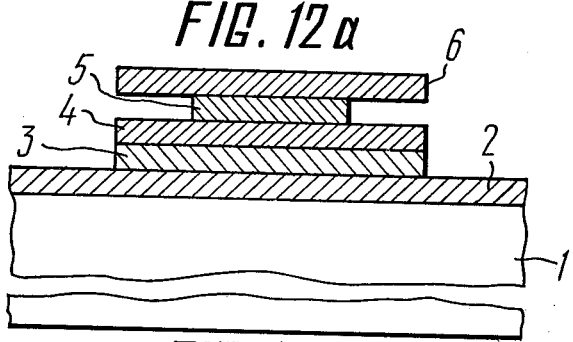
Figure 12C:
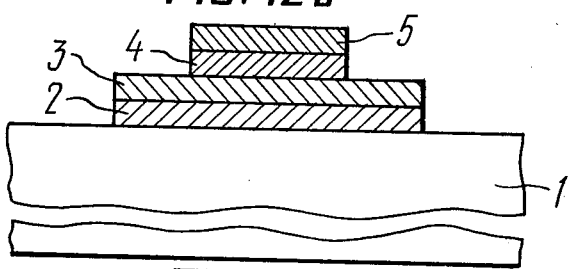
Figure 12D:
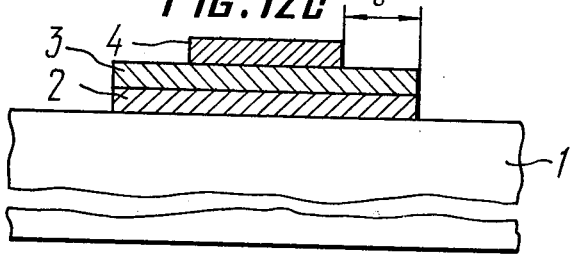

A non-uniform coating consisting of layers 2, 3, 4 and 5 (FIG. 12a) and a pattern of photoresist 6 is applied onto the substrate 1. The layers and the pattern are made of the same materials and with the use of the same technologies as those described above in the first example shown in FIGS. 1a and 1b. Using an etchant similar to that described in the first example the molybdenum layer 5 unprotected with the photoresist 6 is removed. Then, the lower layers 3 and 4 (FIG. 12a) are etched away until the doping layer is reached. The etchant used in this case contains one volume part of hydrofluoric acid, three volume parts of acetic acid and 25 volume parts of a 1% water solution of oxalic acid. Since this etchant etches the first masking layer 4 and the shielding layer 3 approximately at the same rate a structure shown in FIG. 12a will be obtained. Then, the molybdenum layer 5 is etched in the transverse direction with an etchant (described in the first example) until it reaches the required dimensions (FIG. 12b). The photoresist 6 is removed by one of known procedures, while the unprotected areas of the doping layer 2 are removed with the use of a P-etch until the substrate is reached, the composition of the etchant having been given in the first example. Since the P-etch etches the doping layer 2 and the first masking layer 4 at the same rate, a part of the first masking layer 4 unprotected with the second masking layer 5 (FIG. 12c) will be etched away within the time interval required to remove the doping layer 2. Then an etchant for molybdenum which does not etch other layers is used to remove the second masking layer 5 and a structure of FIG. 12d is obtained. In the process described above the width 1 of a strip of the shielding layer 3 depends on the duration of the transverse etching to which the second masking layer 5 is subjected. Then follows a sequence of operations involving the application of an additional masking layer, diffusion, oxidation and selective etching which are similar to those described in the first example. The result is a transistor structure whose cross section is shown in FIG. 9 and its top view in FIG. 10.

EXAMPLE 3

FIGS. 13 through 19 illustrate a series of operations resulting in that the additional masking layer, which limits the length of windows to be exposed, appears below the technological structure. A semiconductor substrate 1 made as a silicon wafer bearing an n-type epitaxial layer is coated with a silicon dioxide additional masking layer 18 about 0.3 microns thick, the application procedure being that of high-frequency sputtering. In this layer a window 19 (FIGS. 13 and 14) is exposed with the help of known procedures. Then, a technological structure 20 is formed on the wafer with the masking layer as shown in FIG. 15 through FIG. 17. The materials and procedures involved are the same as in the first example of FIG. 1. The technological structure 20 is positioned with respect to the window 19 so that its edges are located on the additional masking layer 18 (FIG. 15 through FIG. 17) while the main part of its perimeter, on the substrate 1 within a window 19 (FIG. 15 through FIG. 17). Then follows a sequence of operations involving diffusion, oxidation and selective etching similar to those described in the first example. The result is a transistor structure 22 shown in FIGS. 18 and 19. In contrast to the structure shown in FIGS. 9 and 10 the cross section of the structure obtained with the use of the procedure of the third example (FIG. 18) exhibits a jump in the thickness of the insulating layer 21 at the boundary of the window 19 which is caused by the shielding effect of the layer 18 while the length of the base region 9 depends on the length of the window 19 in the additional masking layer and does not depend on the length of the technological structure 20.

EXAMPLE 4

FIGS. 20 through 23 illustrate a series of operations permitting to manufacture a transistor structure, when the insulating layer is obtained by means of directional sputtering and not by thermal oxidation. According to the procedure a semiconductor wafer 1 (FIG. 20a) is coated with a borosilicate glass doping layer 2 from a solution with subsequent annealing at about 700° C in an argon atmosphere for 10 min. The thickness of the layer 2 is about 0.3 microns. Then the doping layer 2 is coated with a masking layer 3 of aluminum-silicate glass about 0.1 micron thick and a photoresist layer 6 (FIG. 20a). Well known photoengraving techniques are used to form a pattern of the photoresist layer 6 corresponding to the form of the region to be doped (FIG. 20b). The structure is then treated in an etchant containing one volume part of hydrofluoric acid, one volume part of glacial acetic acid, three volume parts of orthophosphoric acid and nine volume parts of a 1%-water solution of oxalic acid to form a structure 23 (FIG. 20c) of the doping 2 and the masking 3 layers. Using the technology of direct application, such as high-frequency sputtering, a silica insulating layer 24 is obtained on the structure. Near the edges of the technological structure the insulating layer 24 is discontinued since the etching angle of said structure is about 90°. The thickness of the insulating layer 24 should not exceed that of the doping layer 2. Then, the masking layer 3 is transversely etched away at the edges of the structure in orthophosphoric acid at 180° C and the doping layer 2 becomes exposed. The width 1 of the strip (FIG. 22) of the exposed doping layer is determined by the duration of the transverse etching procedure. Then, a dopant is diffused in a neutral atmosphere and the areas of the doping layer 2 unprotected with the masking layer 3 are etched in an etchant containing four volume parts of orthophosphoric acid and one volume part of hydrofluoric acid to expose a window (FIG. 23). Then, an additional masking layer is applied and a window is exposed in the additional masking layer so as to expose completely the middle section of the technological structure and to form simultaneously two windows in the insulating layer, while keeping the edges of the structure covered with an additional masking layer. While manufacturing a bipolar transistor, one of the windows is used for emitter diffusion and the other as a window for the base contact.

EXAMPLE 5

Figure 24A:
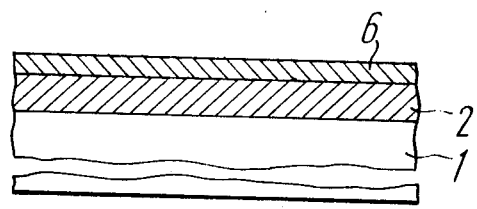
Figure 24B:
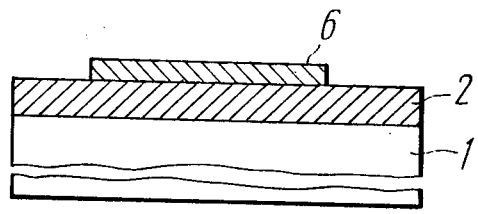
Figure 24C:
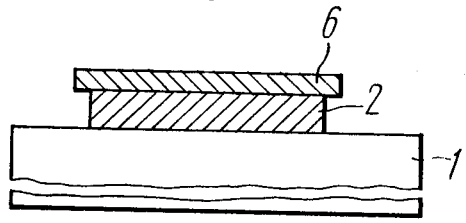

FIGS. 24 through 26 illustrate a series of operations involving the use of a monolayer structure to expose windows for the emitter and the base contact. A semiconductor substrate 1 (FIG. 24a) is coated with a doping layer 2 of a borosilicate glass deposited from a solution. The doping layer is about 0.25 microns thick. The doping layer is coated with a photoresist 6 (FIG. 24a). Then follows a sequence of well known photoengraving operations to form a protective photoresist pattern (FIG. 24b). The doping layer 2 is effected with an etchant containing ten volume parts of a 40%-water solution of ammonium fluoride and one volume part of hydrofluoric acid until the surface of the semiconductor substrate is reached. Then the layer 2 is transversely etched within 10 to 15 minutes to obtain an etching angle approaching 90° (FIG. 24c). The photoresist is removed and the surface of the technological structure is coated with an insulating layer 25 (FIG. 25) of, for instance silicon nitride, using the direct application technology. The thickness of the silicon nitride layer should be less than that of the borosilicate glass layer. Since the technological structure is etched at an angle of approximately 90° the insulating layer breaks at the edge of the technological structure. Then, a dopant is diffused into the semiconductor substrate 1 forming a region 9 and the borosilicate glass layer is etched with an etchant containing four volume parts of orthophosphoric acid and one volume part of hydrofluoric acid until the surface of the semiconductor substrate is reached so as to expose in this way windows 26 (FIG. 26) located along the perimeter of the technological structure. The width of the windows depends on the duration of the etching procedure to which the doping layer 2 is subjected. Subsequent processes are similar to those performed in the first example.

What is claimed is:

1. A method of making semiconductor devices comprising the steps of:
   a. providing a semiconductor substrate having a first type of conductivity;
   b. forming a doping layer on said substrate, said doping layer having a dopant of a second type of conductivity, said doping layer being etchable at a known rate with a first etchant;
   c. forming a shielding layer atop said doping layer, said shielding layer being etchable at a known rate with the first etchant;
   d. forming a first masking layer atop said shielding layer, said masking layer being etchable at a rate higher than said shielding layer;
   e. forming a photoresist pattern on said first masking layer;
   f. forming a technological structure by etching away exposed portions of said masking, shielding and doping layers with the first etchant;
   g. forming an additional masking layer over the entire substrate surface;
   h. diffusing a first region of a second type of conductivity into said substrate from said doping layer;
   i. forming an insulating layer along the perimeter of said technological structure by thermal treatment under oxidizing conditions;
   j. forming a window in said additional masking layer, said window overlapping at least two portions of the perimeter of said technological structure;
   k. forming windows by selectively etching said shielding and masking layers to expose the surface of said region of second type of conductivity using as a mask said first masking layer and said additional masking layer;
   l. diffusing through at least one of said windows a dopant of the first type of conductivity; and
   m. forming a metallization pattern.

2. A method as set forth in claim 1, wherein a second masking layer is formed atop said first masking layer.

3. A method as set forth in claim 1, wherein the exposed portion of said second masking layer is selectively etched.

4. A method as set forth in claim 1, wherein while forming said technological structure said first masking layer is narrowed by etching with an etchant etching said first masking layer at a rate higher than said shielding layer.

5. A method as set forth in claim 1, wherein exposed regions of said second masking layer are selectively etched, exposed regions of said first masking layer are etched away with an etchant having approximately equal etching rates of said first masking layer and said shielding layer, said second masking layer is etched away by selective etching, exposed portions of said doping layer are etched to expose the surface of said substrate by an etchant having equal rates of etching said doping layer and said first masking layer and selectively etching away said second masking layer.

6. A method as set forth in claim 1, wherein said second masking layer is formed of molybdenum.

7. A method as set forth in claim 1, wherein said doping layer is made of a borosilicate glass, said shielding layer is made of aluminum silicate glass containing 30–90 weight percent of aluminum oxide, said first masking layer is made of silicon oxide, said doping layer, said first masking layer and said shielding layer are etched in an etchant comprising 1–7 volume parts of hydrofluoric acid, 1–3 volume parts of glacial acetic acid, 5–10 volume parts 1% solution of oxalic acid and 2–4 volume parts of orthophosphoric acid.

8. A method of making semiconductor devices comprising the steps of:
   a. providing a semiconductor substrate having a first type of conductivity;
   b. forming a first masking layer on said substrate;
   c. forming in said first masking layer at least one window;
   d. forming a doping layer having a dopant of a second type of conductivity atop said first masking layer and overlaying said window;
   e. forming an additional masking layer atop said doping layer;
   f. forming a technological structure etching a portion of said additional masking layer and a portion of said doping layer in such a way that at least two regions of said technological structure along its perimeter would be placed within said window in said first masking layer and at least two portions of said technological structure along its perimeter would be placed outside said window;
   g. narrowing said additional masking layer in said technological structure by etching said additional masking layer in the direction parallel to the surface of said semiconductor substrate;
   h. diffusing a first region of a second type of conductivity into said semiconductor substrate of the first type of conductivity from said doping layer;
   i. forming an insulating layer along the perimeter of said technological structure and overlaying a junction between said semiconductor substrate of the first type of conductivity and the diffused region of the second type of conductivity;
   j. forming windows by etching away the portions of technological structure which are not overlaid by said additional masking layer to expose the portions of the surface of said substrate at regions which are not overlaid by said first masking layer;
   k. diffusing a dopant of the first type of conductivity through at least one of said windows; and
   l. forming a metallization pattern.

* * * * *